(12) United States Patent
Drost et al.

(10) Patent No.: US 7,129,712 B1
(45) Date of Patent: Oct. 31, 2006

(54) ATTOFARAD CAPACITANCE MEASUREMENT

(75) Inventors: Robert J. Drost, Mountain View, CA (US); R. David Hopkins, Hayward, CA (US); Ronald Ho, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/256,733

(22) Filed: Oct. 24, 2005

(51) Int. Cl.
*G01R 27/26* (2006.01)

(52) U.S. Cl. ........................ 324/658; 324/677; 324/678

(58) Field of Classification Search ................ 324/658, 324/677, 678
See application file for complete search history.

(56) References Cited

U.S. PATENT DOCUMENTS

| | | | | |
|---|---|---|---|---|
| 4,743,837 A | * | 5/1988 | Herzog | 324/611 |
| 5,194,819 A | * | 3/1993 | Briefer | 324/684 |
| 5,343,157 A | * | 8/1994 | Deschamps | 324/678 |
| 5,463,388 A | * | 10/1995 | Boie et al. | 341/33 |
| 6,583,632 B1 | * | 6/2003 | Von Basse et al. | 324/678 |
| 6,683,462 B1 | * | 1/2004 | Shimizu | 324/658 |
| 6,987,394 B1 | * | 1/2006 | Drost et al. | 324/680 |

FOREIGN PATENT DOCUMENTS

EP 549354 A2 * 6/1993

* cited by examiner

*Primary Examiner*—Anjan Deb
*Assistant Examiner*—John Zhu
(74) *Attorney, Agent, or Firm*—Park, Vaughan & Fleming, LLP

(57) ABSTRACT

An electrical circuit for determining a capacitance is described. The electrical circuit includes a first device, a rectifying circuit and a feedback circuit. The first device has a first terminal and a second terminal. The first device has a first unknown capacitance and the first terminal may be configured to receive a time-varying voltage signal. The rectifying circuit has an input terminal, an output terminal and a feedback terminal. The input terminal may be coupled to the second terminal and the output terminal may be configured for coupling to an output electrical circuit. The feedback circuit may selectively couple the output terminal to the input terminal using the feedback terminal such that the output terminal and the input terminal are substantially at a common voltage.

17 Claims, 10 Drawing Sheets

ATTOFARAD CAPACITANCE MEASUREMENT

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to electronic circuits. More specifically, the present invention relates to a capacitance-measurement circuit.

2. Related Art

Accurate capacitance models are often useful in the design of high-performance integrated circuits. The delay of logic circuits, bandwidth of analog circuits, and power of cross-chip communication usually depend on wire and device capacitance. In addition, for Proximity Communication using capacitive coupling, chip-to-chip wire capacitance may carry signals between chips. Capacitance models may be designed using a combination of physical equations, 2-dimensional or 3-dimensional field simulations, and/or measured capacitances. Typically, physical equations and measured capacitances may only be available for a limited set of capacitance geometries. Other geometries are often addressed using field simulations. Field simulations may be calibrated using the physical equations and measured capacitances. Precise capacitance measurements may enable improvements in the field simulation parameters and, thus, may provide more accurate capacitance models for high-performance circuit design.

Unfortunately, existing capacitance-measurement techniques often suffer from limited sensitivity. This limitation may be problematic in measuring the capacitances of wires in integrated circuits, which may be extremely small due to submicron dimensions of modern integrated circuit processes. For example, in a 90-nanometer technology a wire may be only 150 nanometers wide and may have a capacitance smaller than a femtoFarad (fF). In order to measure to two significant digits, an accurate measurement technique would, therefore, have an attoFarad (aF) resolution, which may exceed the capability of existing capacitance-measurement techniques.

What is needed, therefore, is a capacitance-measurement circuit offering improved resolution to overcome the problems listed above.

SUMMARY

An electrical circuit for determining a capacitance is described. The electrical circuit includes a first device, a rectifying circuit and a feedback circuit. The first device has a first terminal and a second terminal. The first device has a first unknown capacitance and the first terminal may be configured to receive a time-varying voltage signal. The rectifying circuit has an input terminal, an output terminal and a feedback terminal. The input terminal may be coupled to the second terminal and the output terminal may be configured for coupling to an output electrical circuit. The feedback circuit may selectively couple the output terminal to the input terminal using the feedback terminal such that the output terminal and the input terminal are substantially at a common voltage.

The selection circuit may be a multiplexer. The feedback circuit may be a unity gain buffer. The output electrical circuit may be a current-measurement circuit and the first unknown capacitance may be determined using the current-measurement circuit. The common voltage may be a voltage other than ground.

The first unknown capacitance may correspond to a geometric parameter. The geometric parameter may include a spacing in capacitance-based proximity communication, a spacing in optical communication, an alignment in capacitance-based proximity communication, an alignment in optical communication and/or a process parameter in semiconductor manufacturing.

The rectifying circuit may be a switched capacitor circuit including a first switching mechanism and a second switching mechanism. The first switching mechanism may substantially conduct current and the second switching mechanism may substantially block current for a first pre-determined duration of time. The first switching mechanism may substantially block current and the second switching mechanism may substantially conduct current for a second pre-determined duration of time.

In some embodiments, the electrical circuit may include a second device having a third terminal and a fourth terminal and a selection circuit. The second device has a second unknown capacitance and the third terminal may be configured to receive the time-varying voltage signal. The selection circuit may be configured to couple the fourth terminal to the input terminal and to decouple the second terminal from the input terminal.

In some embodiments, the first switching mechanism may couple the input terminal to an output of the feedback circuit when the first switching mechanism conducts current, and the second switching mechanism may couple the input terminal to the output terminal when the second switching mechanism conducts current.

In some embodiments, the output electrical circuit may be a switched-capacitor circuit including a third switching mechanism and a fourth switching mechanism. The third switching mechanism may substantially conduct current and the fourth switching mechanism may substantially block current for a third predetermined duration of time. The third switching mechanism may substantially block current and the fourth switching mechanism may substantially conduct current for a fourth pre-determined duration of time.

In some embodiments, the third switching mechanism may couple the output terminal to a terminal of a capacitor when the third switching mechanism conducts current and the fourth switching mechanism may couple the terminal of the capacitor to ground when the fourth switching mechanism conducts current. The first unknown capacitance may be determined using a measurement of a voltage at the output terminal.

In some embodiments, a first time period includes the first pre-determined duration of time and the second pre-determined duration of time, a second time period includes the third pre-determined duration of time and the fourth pre-determined duration of time. A ratio of the second time period to the first time period may be used to adjust the voltage at the output terminal.

In some embodiments, a plurality of measurements of the first unknown capacitance performed using the electrical circuit are averaged to improve a signal-to-noise ratio. In some embodiments, the first unknown capacitance may be determined by averaging a first measurement of the first unknown capacitance and a second measurement of the first unknown capacitance. The first measurement may be performed using a first polarity of the time-varying voltage signal and the second measurement may be performed using a second polarity of the time-varying voltage signal.

In an alternate embodiment, a method of determining a capacitance is described. Charge is transferred from the input terminal to the output terminal of the rectifying circuit by repeatedly switching the first switching mechanism in the rectifying circuit back and forth between conducting and blocking current while substantially simultaneously repeatedly switching the second switching mechanism in the rectifying circuit back and forth between blocking and conducting current. The input terminal of the rectifying circuit may be coupled to the device having the unknown capacitance, and the feedback circuit may couple the output terminal to the input terminal such that the output terminal and the input terminal are substantially at the common voltage. A measurement may be performed at the output terminal to determine the unknown capacitance.

BRIEF DESCRIPTION OF THE FIGURES

Like reference numerals refer to corresponding parts throughout the drawings.

DETAILED DESCRIPTION

Figure 1:
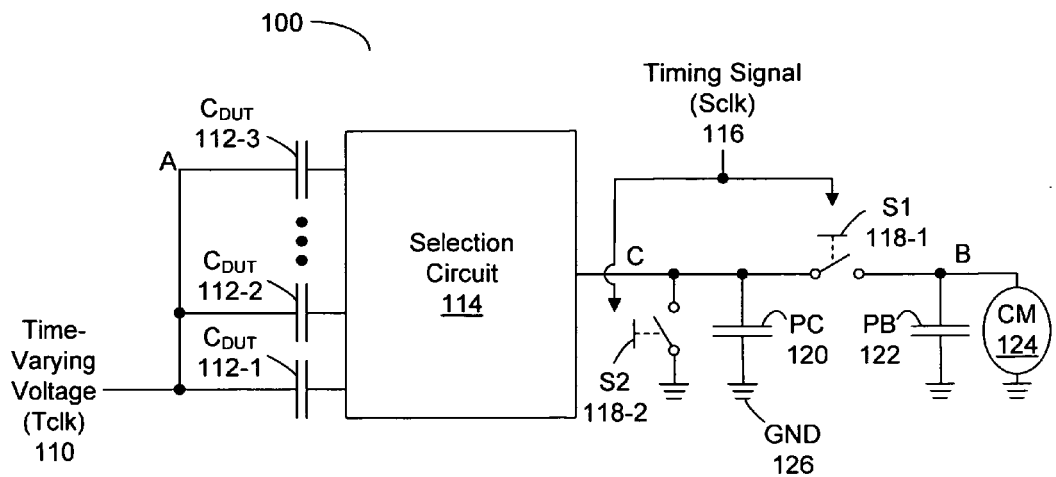
FIG. 1 is a block diagram illustrating an existing capacitance-measurement circuit.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a capacitance-measurement circuit and techniques for measuring capacitance are described. In some embodiments of the capacitance-measurement circuit, a time-varying voltage may be applied to a first terminal of a device having an unknown capacitance. In some embodiments, the device may be selected from a plurality of devices. A second terminal of the device may be selectively coupled to an output terminal by a rectifying circuit, such as a switched-capacitor circuit that includes at least two switching mechanisms. The output terminal may also be selectively coupled to the second terminal of the device using a feedback circuit such that the output terminal and the second terminal are substantially at a common voltage. The common voltage may be different than ground. When the second terminal of the device is coupled to the output terminal, an output of the feedback circuit may be decoupled from the second terminal, and when the second terminal of the device is decoupled from the output terminal, the output of the feedback circuit may be coupled to the second terminal.

In some embodiments, the output terminal may be coupled to an output electrical circuit. The output electrical circuit may determine a quantity, such as a current, that may be used to determine the unknown capacitance.

In some embodiments, the output electrical circuit may be a switched-capacitor circuit, including at least two switching mechanisms. The switching mechanisms in the output electrical circuit may selectively couple the output terminal to ground or a terminal of a capacitor. The unknown capacitance may be determined by measuring a voltage at the output terminal. A ratio of a period of a signal used to control the selective coupling in the rectifying circuit to a period of a signal used to control the selective coupling in the output electrical circuit may be used to adjust the voltage, for example, to a value with a range of values that is suitable for measurement with a voltmeter.

Two or more capacitance measurements performed using the embodiments of the capacitance-measurement circuit may be averaged to improve a signal-to-noise ratio. In some embodiments, capacitance measurements may be performed using different polarities of the time-varying voltage to allow correction for offset voltages.

The embodiments of the capacitance-measurement circuit may offer an improvement in the resolution of capacitance measurements. In an exemplary embodiment, capacitance values on the order of attoFarads ($10^{-18}$ F) may be determined. Such sensitive capacitance measurements may be used to determine one or more spacings in capacitance-based proximity communication, one or more spacings in optical communication, one or more alignment in capacitance-based proximity communication (for example, in 2-dimensions or 3-dimensions), one or more alignment in optical communication and/or one or more process parameters in semiconductor manufacturing (for example, a difference between a mask pattern and actual printed pattern, or a thickness of a metal layer). The sensitive capacitance measurements may allow the use of smaller test or monitoring structures on wafers. The sensitive capacitance measurements may also be of use in instrumentation, material science and/or physical science applications.

The capacitance-measurement circuit may offer improved sensitivity relative to existing capacitance-measurement circuits. Attention is now directed towards a discussion of some of these existing capacitance-measurement circuits.

In some existing capacitance-measurement techniques, a capacitance is measured by repeatedly coupling charge through a capacitor under test and determining an average amount of charge pumped through the capacitor per measurement cycle time or period. This measurement method is challenging due to a combination of effects.

During a measurement cycle time, the charge flows rapidly at first but then quite slowly exhibiting a long tail characteristic of a resistor-capacitor (R-C) decay. As a consequence, an average value of the charge per unit measurement cycle time, i.e., a current, is much lower than a peak value of the current. If an ammeter is used to measure the average charge pumped over the measurement cycle time, there may be challenges associated with properly sensing a low average charge flow and averaging a time-varying waveform. In addition, the measurement cycle time may be limited due to an R-C time constant associated with a circuit topography. As a consequence, the current that may be pumped through the capacitor may also be limited.

Figure 4:
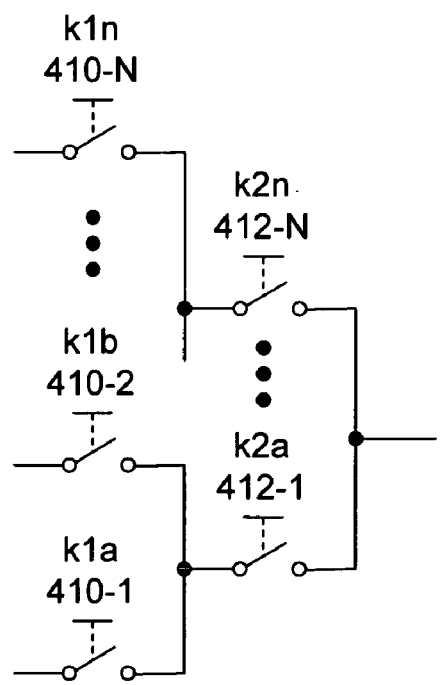
FIG. 4 is a block diagram illustrating an embodiment of a switching matrix.

FIG. 1 is a block diagram illustrating an existing capacitance-measurement circuit 100. The capacitance-measurement circuit 100 measures a capacitance for a capacitor device under test $C_{DUT}$ 112-1, which may be selected from a plurality of capacitor devices 112 using a selection circuit 114. As shown in FIG. 4, the selection circuit 114 may be a multiplexer or a switching matrix, which uses control voltages k1a to k1n 410 and k2a to k2n 412 to couple one or more capacitor devices 112 (FIG. 1) being tested to node C.

Referring back to FIG. 1, a time-varying voltage Tclk 110 may be coupled to one terminal of the capacitor device under test $C_{DUT}$ 112-1. A timing signal Sclk 116 may operate two switches, S1 118-1 and S2 118-2, such that S1 118-1 conducts current and S2 118-2 blocks current during a rising edge of the time-varying voltage Tclk 110, and such that S1 118-1 blocks current and S2 118-2 conducts current during a falling edge of the time-varying voltage Tclk 110. As described in FIG. 2 below, the time-varying voltage Tclk 110 may rise and fall at a common or same frequency f as the timing signal Sclk 116. A relative phase of the time-varying voltage Tclk 110 may, however, be different than that of the timing signal Sclk 116.

In addition to the capacitor device under test $C_{DUT}$ 112-1, parasitic capacitors $P_C$ 120 and $P_B$ 122 (corresponding, for example, to a capacitance associated with a semiconductor die or chip and/or a circuit board, respectively), coupled to a local or global ground 126, may load nodes C and B, respectively. Although these capacitors may slow edge transition rates in the capacitance-measurement circuit 100 and may limit a current magnitude, their affect on the average current may be reduced or eliminated by the measurement technique described below.

During a rising edge of the time-varying voltage Tclk 110, positive charge transfers across the capacitor device under test $C_{DUT}$ 112-1 from node A to node C. Since the switch S1 118-1 is conducting, this charge flows to node B and then through a current-measurement device CM 124. After a time interval, nearly all of the charge flows through the current-measurement device CM 124, leaving nodes B and C at a voltage value near or equal to the ground 126.

During a falling edge of the time-varying voltage Tclk 110, negative charge transfers across the capacitor device under test $C_{DUT}$ 112-1 from node A to node C. Since the switch S1 118-1 is blocking and the switch S2 118-2 is conducting, current flows from ground 126 to node C through the switch S2 118-2. However, little or no current flows through the current-measurement device CM 124. After some time period, node C is recharged to a voltage value of near or equal to ground 126.

For proper operation, i.e., in order for current to drain through the current-measurement device CM 124 and not the switches S1 118-1 and S2 118-2, a voltage on node C must recover to ground 126 after each transition of the time-varying voltage Tclk 110 and before the next transition of the timing signal Sclk 116 or the time-varying voltage Tclk 110. In order for the voltage on node C to recover to nearly ground 126 before the next timing signal transition, the signals may remain approximately constant for a number N of R-C time constants. Typical values of N may be 3–5.

Figure 2:
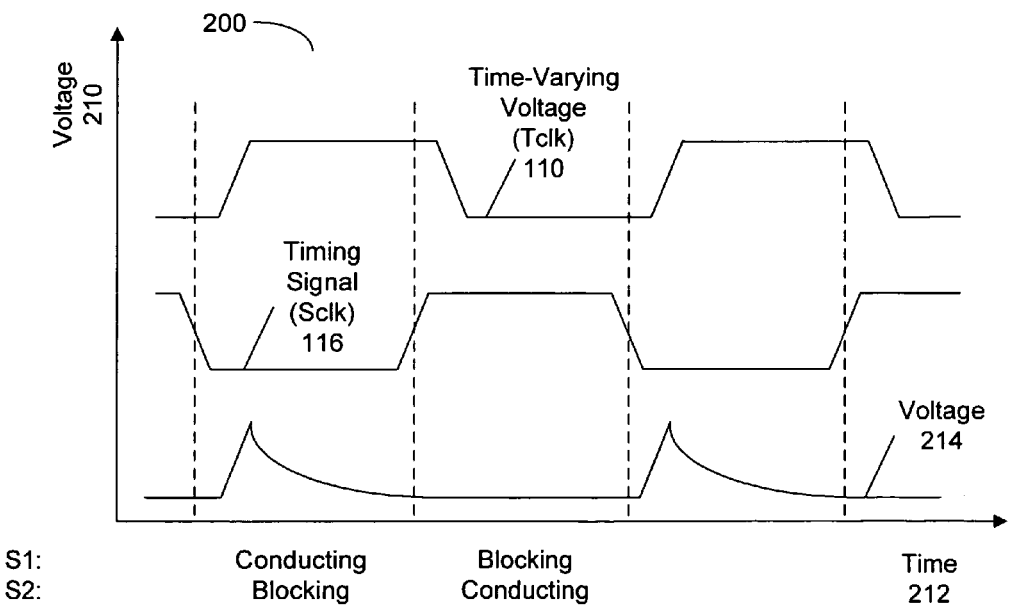
FIG. 2 is a block diagram illustrating existing capacitance-measurement circuit waveforms.

FIG. 2 is a block diagram illustrating existing capacitance-measurement circuit waveforms 200, showing voltage 210 as a function of time 212. The time-varying voltage Tclk 110 and the timing signal Sclk 116 have a common frequency but may be offset in phase. The voltage 214 on node C (FIG. 1) is show for different blocking/conducting configurations of the switches 118 (FIG. 1). Note the separation between voltage transients due to the recovery time described in the preceding paragraph. The constraints on this separation, i.e., on the frequency f of the time-varying voltage Tclk 110 and the timing signal Sclk 116 limit the current in the capacitance-measurement circuit 100 (FIG. 1).

Figure 3:
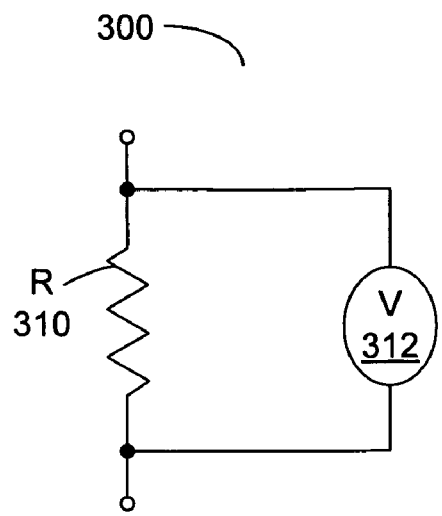
FIG. 3 is a block diagram illustrating an embodiment of a current-measurement device.

FIG. 3 is a block diagram illustrating an embodiment of a current-measurement device 300, such as the current-measurement device CM 124 (FIG. 1). The current-measurement device 300 has a resistor R 310 having a high resistance in parallel with a sensitive voltmeter 312. The resistor R 310 converts a small current into a voltage that is measured by the voltmeter 312. The resistor R 310 may drain from the capacitor device under test $C_{DUT}$ 112-1 (FIG. 1), as well as parasitic capacitors $P_C$ 120 and $P_B$ 122 (FIG. 1).

The resistor R 310 may determine the R-C time constant of the capacitance-measurement circuit 100 (FIG. 1). However, the resistor R 310 may not actually set an overall measurement resolution. This is derived below.

Referring back to FIG. 1, a total constant capacitance Ctotal equals a summation of a capacitance for the capacitor device under test $C_{DUT}$ 112-1, and the parasitic capacitances corresponding to the parasitic capacitors $P_C$ 120 and $P_B$ 122. The charge Q transferred during each rising edge of the time-varying voltage Tclk 110 equals $C_{DUT} \cdot V_{swing}$, where Vswing is a voltage swing of the time-varying voltage Tclk 110. The average current Iavg equals the charge Q multiplied by the frequency f of the time-varying voltage Tclk 110 and the timing signal Sclk 116.

In order to permit sufficient time for nodes C and B to recover to the ground voltage 126, and hence for most or all transferred charge to drain through the current-measurement device CM 124, the time-varying voltage Tclk 110 may be held approximately constant for the N time constants during each measurement cycle time. With a 50% duty cycle for the time-varying voltage Tclk 110 and the timing signal Sclk 116, and with a small resistance of the switch S2 118-2, the dominant time constant is associated with the current-measurement device CM 124, i.e., R·Ctotal. As a consequence, a minimum value of the frequency f is $$\frac{1}{2NRC_{total}}.$$

The average current Iavg is $$\frac{C_{DUT}V_{swing}}{2NRC_{total}}.$$

Since the current-measurement device CM 124 may be modeled as the resistance R 310 (FIG. 3) in parallel with the sensitive voltmeter 312 (FIG. 3), the average voltage Vavg at node B is $$I_{avg}R = \frac{C_{DUT}V_{swing}}{2NC_{total}}.$$

Note that the equivalent input resistance R 310 (FIG. 3) of the current-measurement device 300 (FIG. 3) drops out because it both multiplies the average current Iavg and limits a maximum frequency of operation.

Commercially available sensitive nano-voltmeters have a voltage sensitivity of some 10 nV. Using this sensitivity and assuming a Vswing of 1 V for the time-varying voltage Tclk 100, a Ctotal of 100 pF, and N equal to 5 (i.e., 5 time constants of waiting before cycling the time-varying voltage Tclk 110), a maximum capacitance resolution of the capacitance-measurement circuit 100 is derived to be some 10 aF. For measurements having at least two significant digits of accuracy, capacitances of 1 fF may be measured.

In practice, this maximum capacitance resolution may be difficult to achieve. For example, if the voltmeter 312 (FIG. 3) has nonlinearities, it may introduce an error when attempting to average the waveform on node B due to the large dynamic range of the waveform, as evidenced by the exponential spikes in the voltage 214 (FIG. 2).

In summary, the existing capacitance-measurement circuit 100 provides a measurement technique to measure an unknown capacitance by rectifying a time-varying current passing through the capacitor device under test $C_{DUT}$ 112-1. By measuring all of one polarity of the current through the current-measurement device CM 124, the average current Iavg is proportional to only the capacitance of the capacitor device under test $C_{DUT}$ 112-1. Parasitic capacitance, such as those associated with the parasitic capacitors $P_C$ 120 and $P_B$ 122 may not significantly affect the measured average current Iavg.

Unfortunately, the parasitic capacitors $P_C$ 120 and $P_B$ 122 may be quite large and in combination with the input resistance R 310 (FIG. 3) of the current-measurement device 300 (FIG. 3), may result in a large R-C time constant. While waiting for all of the charge to flow through the current-measurement device 300 (FIG. 3), i.e., by limiting the frequency f, the large R-C time constant in effect limits the sensitivity of the capacitance measurement.

Attention is now directed towards embodiments of the improved capacitance-measurement circuit and related measurement techniques. In these embodiments, a feedback circuit coupling the switch S1 118-1 (FIG. 1) and the switch S2 118-2 (FIG. 1) is used to relax the requirement that all charge flow through the current-measurement device CM 124 (FIG. 1) during each measurement cycle time. Instead, the charge flow is permitted to occur over many measurement cycle times. As a consequence, the voltage on nodes B and C may be nonzero throughout most or all of at least a plurality of the measurement cycle times. In the embodiments of the improved capacitance-measurement circuit, a voltage across the switch S1 118-1 (FIG. 1) and a voltage across the switch S2 118-1 (FIG. 1) may be zero before a respective switch turns off (blocking current) or on (conducting current). By combining a relaxed switching requirement with an additional amplifier in the feedback circuit, the R-C time constant may be significantly reduced. This may enable higher-speed operation of the capacitance-measurement circuit, i.e., a higher frequency f for the time-varying voltage Tclk 110 (FIG. 1) and the timing signal Sclk 116 (FIG. 1). (In an exemplary embodiment, the frequency f may be selected from a range of frequencies between tens of kHz and several GHz.) In addition, the voltmeter 312 (FIG. 3), which may be coupled to the improved capacitance-measurement circuit, measures a waveform that has small ripples as opposed to large spikes. As a consequence, the improved capacitance-measurement circuit may allow more sensitive current-measurement resolution, and thus, improved capacitance resolution.

In another embodiment discussed further below with reference to FIG. 9, a switched-capacitor circuit is coupled to the output of the capacitance-measurement circuit to reduce and/or eliminate a small error source in the measurement.

Figure 5:
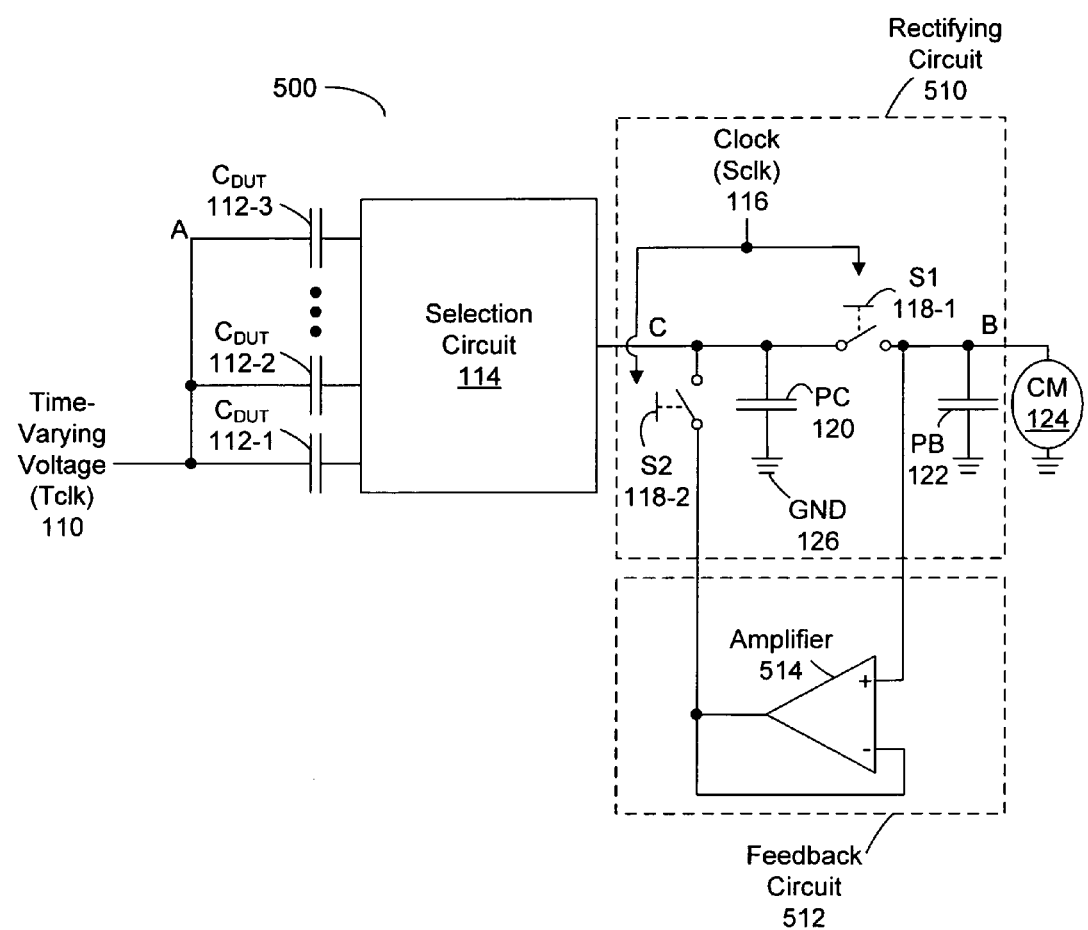
FIG. 5 is a block diagram illustrating an embodiment of a capacitance-measurement circuit.

FIG. 5 is a block diagram illustrating an embodiment of a capacitance-measurement circuit 500, including a rectifier circuit 510 and a feedback circuit 512. The feedback circuit 512 may include an amplifier 514, such as an operational amplifier. In an exemplary embodiment, the amplifier 514 is a unity-gain buffer with a positive input terminal coupled to node B and whose output feedbacks to a negative input terminal of the amplifier 514. The switch S2 118-2 is coupled to the output of the amplifier 514. This amplifier 514 drives a copy of the signal at node B onto the switch S2 118-2.

In the capacitance-measurement circuit 500, the time-varying voltage Tclk 110 alternately rises and falls at the common frequency f as the timing signal Sclk 116 but is shifted in phase, as illustrated in FIG. 2. The switch S1 118-1 conducts current and the switch S2 118-2 blocks current during the rising edge of the time-varying voltage Tclk 110. However, instead of waiting for node B to be discharged to ground 126 before switching the timing signal Sclk 116, we may only wait for nodes B and C to only equalize to the same or common voltage before switching the timing signal Sclk 116. The reason for this is that the amplifier 514 may not introduce a new voltage onto node C when the switch S1 118-1 blocks current and the switch S2 118-2 conducts current. Rather, the amplifier 514 may simply maintain the voltage on node C substantially equal to that on node B.

When the time-varying voltage Tclk 110 has a falling transition, the amplifier 514 absorbs the charge, while still maintaining the voltage on node C to be substantially equal to that on node B. In a sense, the discharging of node B to ground 126 in the capacitance-measurement circuit 100 (FIG. 1) may now take place over many measurement cycle times rather than having to be accomplished fully during each measurement cycle time. The new time constant that limits the switching speed in the capacitance-measurement circuit 500 is given by the product of the resistance of the switches S1 118-1 and S2 118-2 times the series combination of the capacitance on either side of the respective switch that conducts current during a rising transition or a falling transition of the time-varying voltage 110.

A settling time constant after a rising transition in the time-varying voltage 110 is $$\frac{R_{S1}}{\frac{1}{C_{P_C}+C_{DUT}}+\frac{1}{C_{P_B}}},$$

where $R_{S1}$ is the resistance of the switch S1 118-1, $C_{P_C}$ is the capacitance of parasitic capacitor 120 and $C_{P_B}$ is the capacitance of parasitic capacitor 122. In an exemplary embodiment, where capacitor $P_B$ 122 is a board capacitor that has a capacitance that is much larger than the capacitance of an on-chip capacitor $P_C$ 122, which in turn is much larger than the capacitance of the capacitance device under test $C_{DUT}$ 112-1, the settling time constant may be approximated as $R_{S1}*C_{PC}$. Similarly, a settling time after falling transitions may be approximated as $R_{S2}*C_{PC}$, where $R_{S2}$ is the resistance of the switch S2 118-2.

An expression for the average voltage Vavg in the capacitance-measurement circuit 500 is $$\frac{C_{DUT}V_{swing}}{C_{P_C}} \cdot \frac{R}{R_{S1} + R_{S2}}.$$

Resistances $R_{S1}$ and $R_{S2}$ may be designed to be much smaller than the resistance R 310 (FIG. 3) of the current-measurement device 300 (FIG. 3) in order to produce a larger average voltage Vavg. Given a similar voltage resolution for the voltmeter 312 (FIG. 3) as was assumed in the previous calculation, the current-measurement resolution is increased versus that of existing current-measurement circuits. In an exemplary embodiment, the resistance R 310 (FIG. 3) may be 2 MΩ and $R_{S1}$ plus $R_{S2}$ may be 2 kΩ. The corresponding resolution of the capacitance-measurement circuit 500 is increased by some 1000× relative to the capacitance-measurement circuit 100 (FIG. 1) resulting in a measurement resolution of 0.01 aF.

While the capacitance-measurement circuit 500 has been illustrated as including the current-measurement device CM 124, in some embodiments the current-measurement device CM 124 may be separate from the capacitance-measurement circuit 500. Some of all of the capacitance-measurement circuit 500 may be implemented using discrete components on a circuit board and/or as an integrated circuit. The capacitance-measurement circuit 500 may be implemented as a module in a larger integrated circuit. The capacitance-measurement circuit 500 may include fewer or additional components. A position of two or more components may be changed. Functions of two or more components may be combined.

Figure 6:
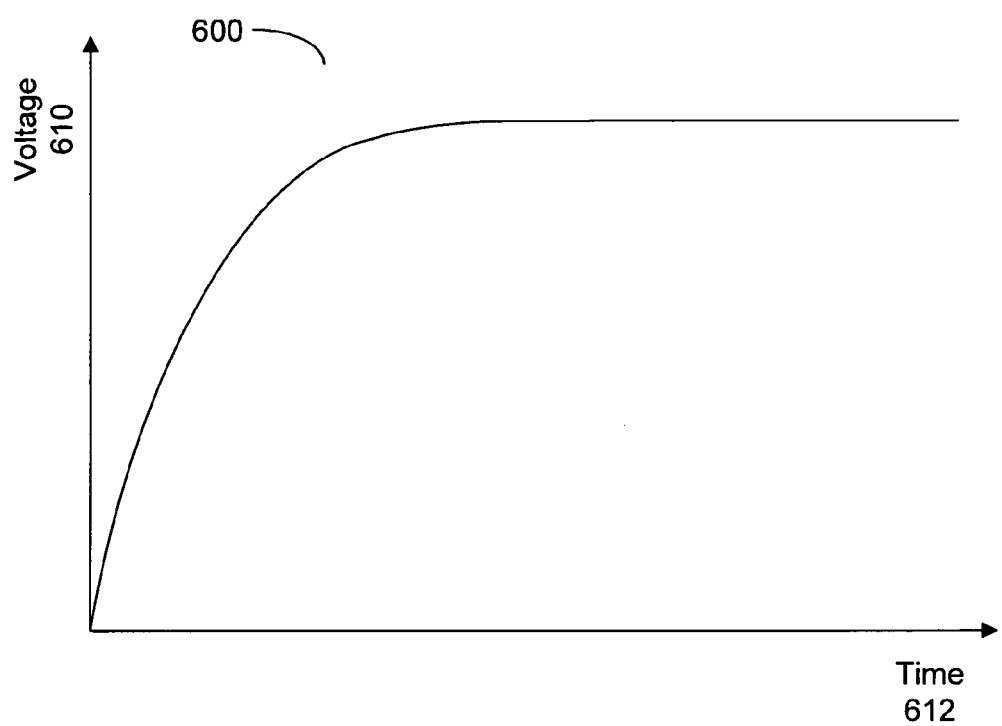
FIG. 6 is a block diagram illustrating an embodiment of a waveform in a capacitance-measurement circuit.

FIG. 6 is a block diagram illustrating an embodiment of a waveform 600 in a capacitance-measurement circuit, such as the capacitance-measurement circuit 500 (FIG. 5). A voltage 610 on node B (FIG. 5) is shown as a function of time 612. The voltage on node B (FIG. 5) rises to a steady-state value. A maximum voltage on node B (FIG. 5) may be limited by a compliance of the amplifier 514 (FIG. 5) and/or of the switches S1 118-1 (FIG. 5) and S2 118-2 (FIG. 5). During an initial time interval of operation, such as a first 200 ns, a voltage on nodes B (and C) starts at ground 126 and progressively builds up over successive measurement cycle times.

Figure 7:
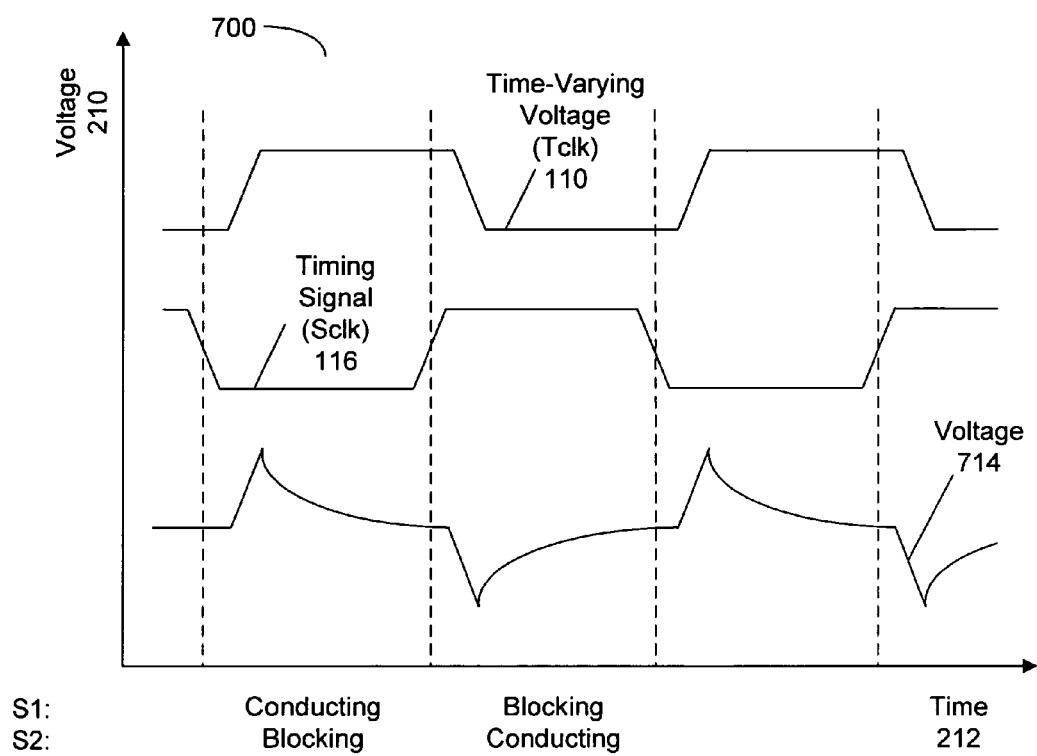
FIG. 7 is a block diagram illustrating an embodiment of waveforms in a capacitance-measurement circuit.
Figure 8:
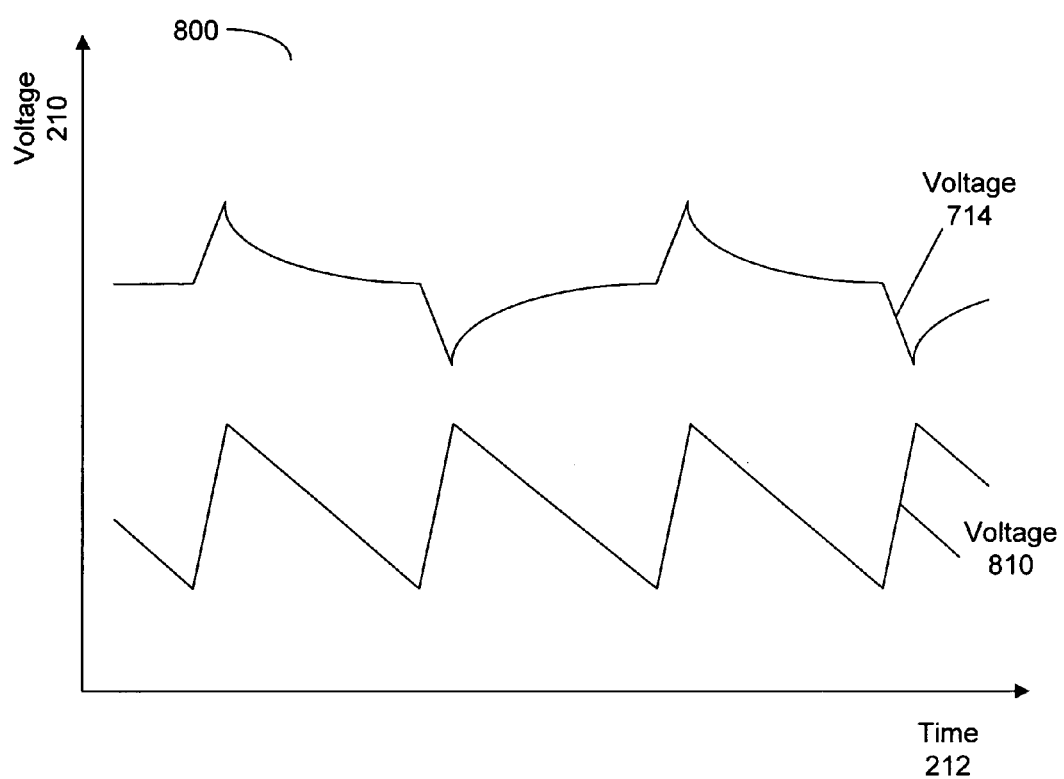
FIG. 8 is a block diagram illustrating an embodiment of waveforms in a capacitance-measurement circuit.

FIG. 7 is a block diagram illustrating an embodiment of waveforms 700 in a capacitance-measurement circuit, such as the capacitance-measurement circuit 500 (FIG. 5), including a voltage 714 on node C during steady-state operation (for example, after some 40 μs of operation). FIG. 8 is a block diagram illustrating an embodiment of waveforms 800 in a capacitance-measurement circuit, such as the capacitance-measurement circuit 500 (FIG. 5), including a voltage 810 on node B during steady-state operation (for example, after some 40 μs of operation). Note that the time 212 axis in FIG. 8 is magnified (finer scale) that in FIG. 6. The voltage 714 on node C may exhibit positive spikes due to an injection of charge through the capacitor device under test $C_{DUT}$ 112-1 (FIG. 5). The voltage 810 on node B, however, may not show such spikes due to shielding through the switch S1 118-1 (FIG. 5).

Negative spikes in the voltage 714 may be absorbed by the feedback circuit 512 (FIG. 5). As a consequence, an amplitude of such negative spikes may be significantly reduced at node B. The positive spikes couple through the switch S1 118-1 (FIG. 5), but may not cause node B to jump to a new value without overshoot. For the steady-state operation, each positive step on the node B associated with coupled charge may be approximately or exactly offset by current drained through the resistance R 310 (FIG. 3) of the current-measurement device 300 (FIG. 3) before the next coupled charge event.

While the waveforms 700 are shown for a particular configuration of polarities for the time-varying voltage 110 and the timing signal 116, in other embodiments various permutations on 180° phase shifts of one or both of the time-varying voltage 110 and the timing signal 116 may be used.

Note that while the switch S1 118-1 (FIG. 5) is blocking current, the current-measurement device CM 124 (FIG. 5) may only discharge the capacitor $P_B$ 122 on node B, rather than on both nodes B and C (i.e, there is a difference in the time constant when the switch S1 118-1 conducts current and when the switch S1 118-1 blocks current). This may introduce a measurement error if not explicitly accounted for. One approach to addressing this error is to minimize a duration of time for which the switch S1 118-1 (FIG. 5) is blocking current and a duration of time for which the switch S2 118-2 (FIG. 5) is conducting current. As described below with reference to FIGS. 9–11, in another embodiment of the capacitance-measurement circuit, this error may be reduced or eliminated by replacing the current-measurement device CM 124 (FIG. 5) with a switched-capacitor filter. In an alternate embodiment, the measurement error may be reduced or eliminated in a capacitance-measurement circuit that includes a current-measurement device by adjusting a duty cycle for the switch S1 118-1 (FIG. 5) and by adjusting a ratio of the capacitance corresponding to the capacitor $P_B$ 122 (FIG. 5) to the capacitance corresponding to the capacitor $P_C$ 120 (FIG. 5).

Figure 9:
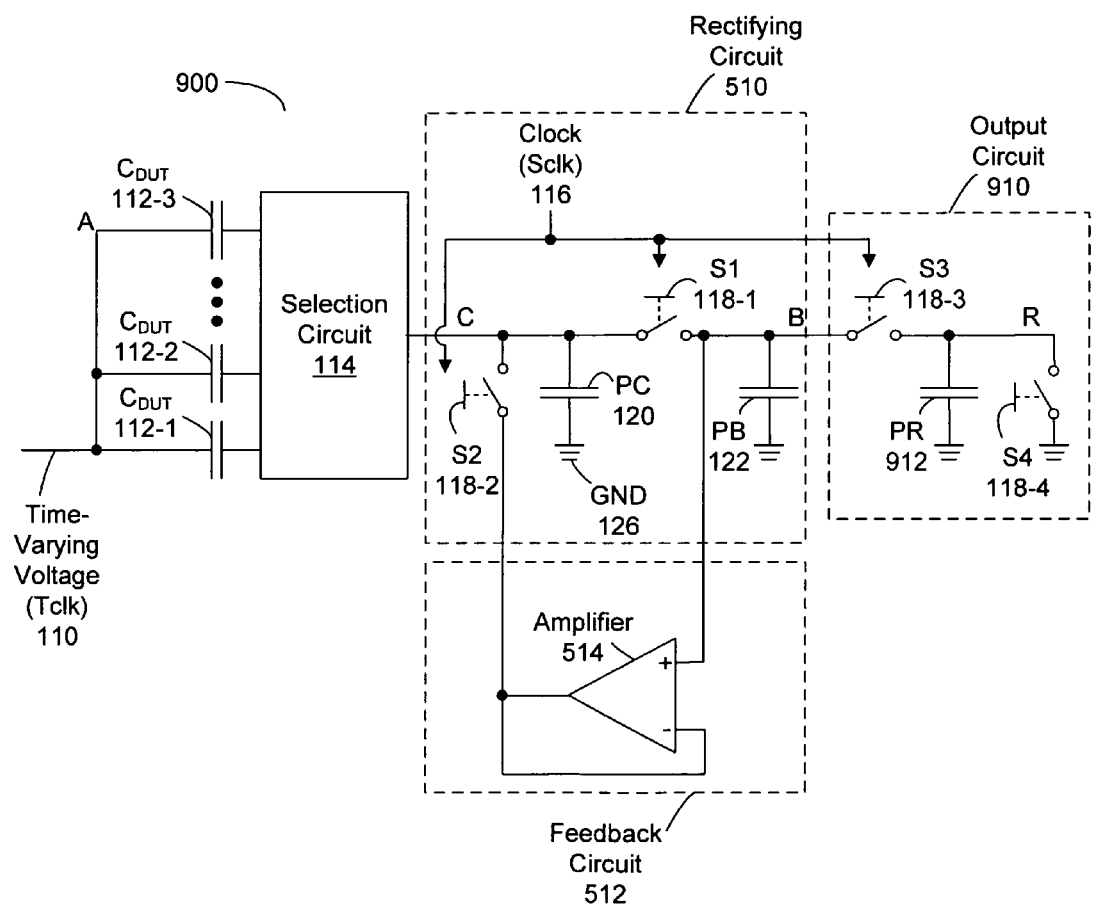
FIG. 9 is a block diagram illustrating an embodiment of a capacitance-measurement circuit.
Figure 10:
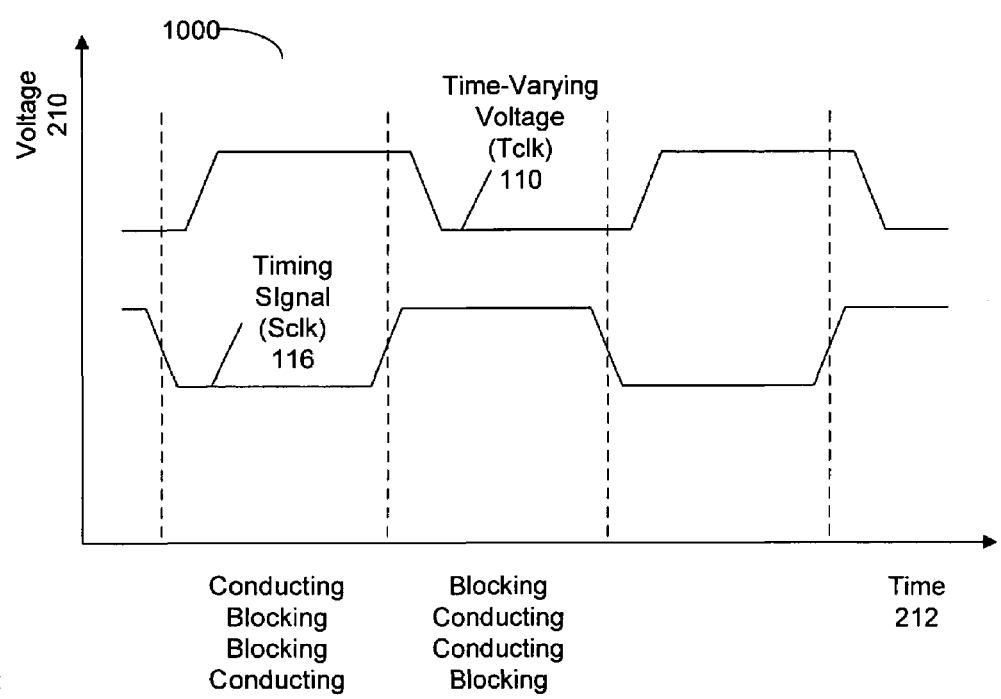
FIG. 10 is a block diagram illustrating an embodiment of control signals in a capacitance-measurement circuit.

FIG. 9 is a block diagram illustrating an embodiment of a capacitance-measurement circuit 900. The current-measurement device 524 (FIG. 5) in the capacitance-measurement circuit 500 (FIG. 5) has been replaced with an output circuit 910. The output circuit 910 implements a switched-capacitor circuit, including switch S3 118-3, switch S4 118-4, and capacitor $P_R$ 512. As shown in FIG. 10, which is a block diagram illustrating an embodiment of control signals 1000 in a capacitance-measurement circuit (such as the capacitance-measurement circuit 900 (FIG. 9)), the switches S3 118-3 (FIG. 9) and S4 118-4 (FIG. 9) operate in step with the switches S1 118-1 (FIG. 9) and S2 118-2 (FIG. 9). Referring back to FIG. 9, the switches S3 118-3 and S4 118-4 alternately connect the capacitor $P_R$ 512 to node B or to ground 126. In this way, charge is transferred from node B to node R, and from node R to ground 126. In an exemplary embodiment, a capacitance corresponding to the capacitor $P_R$ 512 is small. If the capacitor $P_R$ 512 is implemented on chip it may be on the order of fF. If the capacitor $P_R$ 512 is implemented off chip it may be on the order of pF.

Settling times of the switches 118 may determine a maximum frequency f of operation of the capacitance-measurement circuit 900. However, the settling times of the switches 118 may not affect the steady-state voltage on node B. Instead, as the capacitance-measurement circuit 900 is cycled through multiple measurement cycle times, node B is charged to about the steady-state value. At steady state, an amount of charge that is transferred from node B is equal to an amount of charge that is transferred to node B. In an exemplary embodiment, the steady-state voltage on node B is reached after a time of approximately $$\frac{3C_{P_B}}{C_{DUT}},$$

where $C_{P_B}$ is the capacitance associated with the capacitor $P_B$ 122.

A sensitive voltmeter may be used to measure the voltage on node B. The steady-state voltage on node B balances each cycle the amount of charge added to the node B by $C_{DUT}$ against the amount of charge removed via node R and capacitor $P_R$ 512. The steady-state voltage on node B is $$\frac{V_{swing}C_{DUT}}{C_{P_R}},$$

where $C_{P_R}$ is the capacitance associated with the capacitor $P_R$ 512.

In an exemplary embodiment, assuming the capacitance corresponding to the capacitor $P_R$ 512 equals 5 fF and Vswing equals 1 V, a voltmeter resolution of 10 nV results in a capacitance-measurement resolution of 0.00005 aF or $5 \cdot 10^{-23}$ F.

Note that by changing a ratio of a frequency used to cycle switches S1 118-1 and S2 118-2 ($F_{S12}$) versus a frequency used to cycle switches S3 118-3 and S4 118-4 ($F_{S34}$), the steady-state voltage on node B may be modified. In particular, the steady-state voltage on node B equals $$\frac{V_{swing}C_{DUT}}{C_{P_R}} \cdot \frac{F_{S12}}{F_{S34}}.$$

This allows the measurement resolution to be increased or decreased (i.e., it allows a form of auto-ranging), and permits a larger range of capacitance measurements for a given voltmeter range. For example, it may be convenient to build a sensitive voltmeter, but the voltmeter may have a limited voltage range. By changing the frequency ratio ($F_{S12}/F_{S34}$) this scenario may be accommodated. In an exemplary embodiment, a variation about the steady-state voltage on node B may equal 100 mV.

While the capacitance-measurement circuit 900 has been illustrated as including the output circuit 910, in some embodiments the output circuit 910 may be separate from the capacitance-measurement circuit 900. Some of all of the capacitance-measurement circuit 900 may be implemented using discrete components on a circuit board and/or as an integrated circuit. The capacitance-measurement circuit 900 may be implemented as a module in a larger integrated circuit. The capacitance-measurement circuit 900 may include fewer or additional components. A position of two or more components may be changed. Functions of two or more components may be combined.

Referring to FIG. 10, while the control signals 1000 are shown for a particular configuration of polarities for the time-varying voltage 110 and the timing signal 116, in other embodiments various permutations on 180° phase shifts of one or both of the time-varying voltage 110 and the timing signal 116 may be used.

Figure 11:
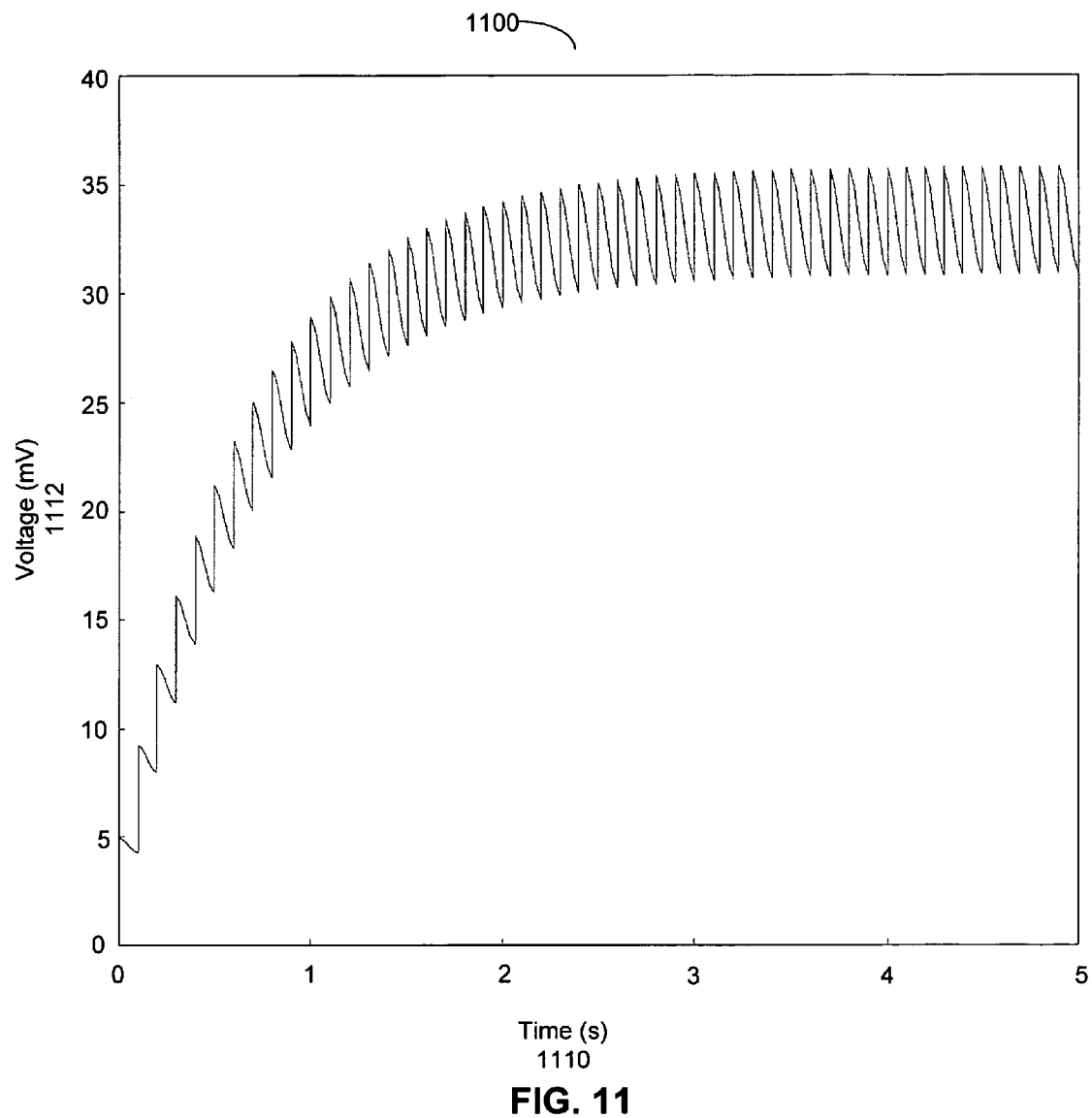
FIG. 11 is a block diagram illustrating an embodiment of a waveform in a capacitance-measurement circuit.

FIG. 11 is a block diagram illustrating an embodiment of a waveform 1100 in a capacitance-measurement circuit, such as the capacitance-measurement circuit 900 (FIG. 9). The waveform, shown as a voltage 1110 as a function of time 1112, corresponds to the voltage on node B (FIG. 9). Note that the voltage on node B takes a number of measurement cycles to reach steady-state and then ripples slightly up and down as charge is added by capacitor device under test $C_{DUT}$ 112-1 (FIG. 9), and removed by the capacitor $P_R$ 512 (FIG. 9), i.e, the switched-capacitor load.

Note that leakage in the switches 118 (FIG. 9) due to sub-threshold conduction and/or diode leakage may still result in small residual errors in the embodiments of the capacitance-measurement circuit. However, the voltages on nodes C, B, and R are usually quite small. As a consequence, the leakage and error should be diminishingly small. Other error sources, including switching effects such as charge feed through and channel charge, as well as offset voltages in the amplifier 514 (FIG. 9), may introduce offset voltages in the capacitance measurements. Such offset voltages may be reduced or eliminated by combining measurement results performed with different polarities for the time-varying voltage Tclk 110 (FIG. 9). In an exemplary embodiment, the offset may be reduced or eliminated by taking the average of the difference of opposite polarity voltage and/or capacitance measurements. For a given polarity, one or more capacitance measurements and/or one or more voltage measurements may be performed when the voltage on node B has reached the steady-state value.

Figure 12:
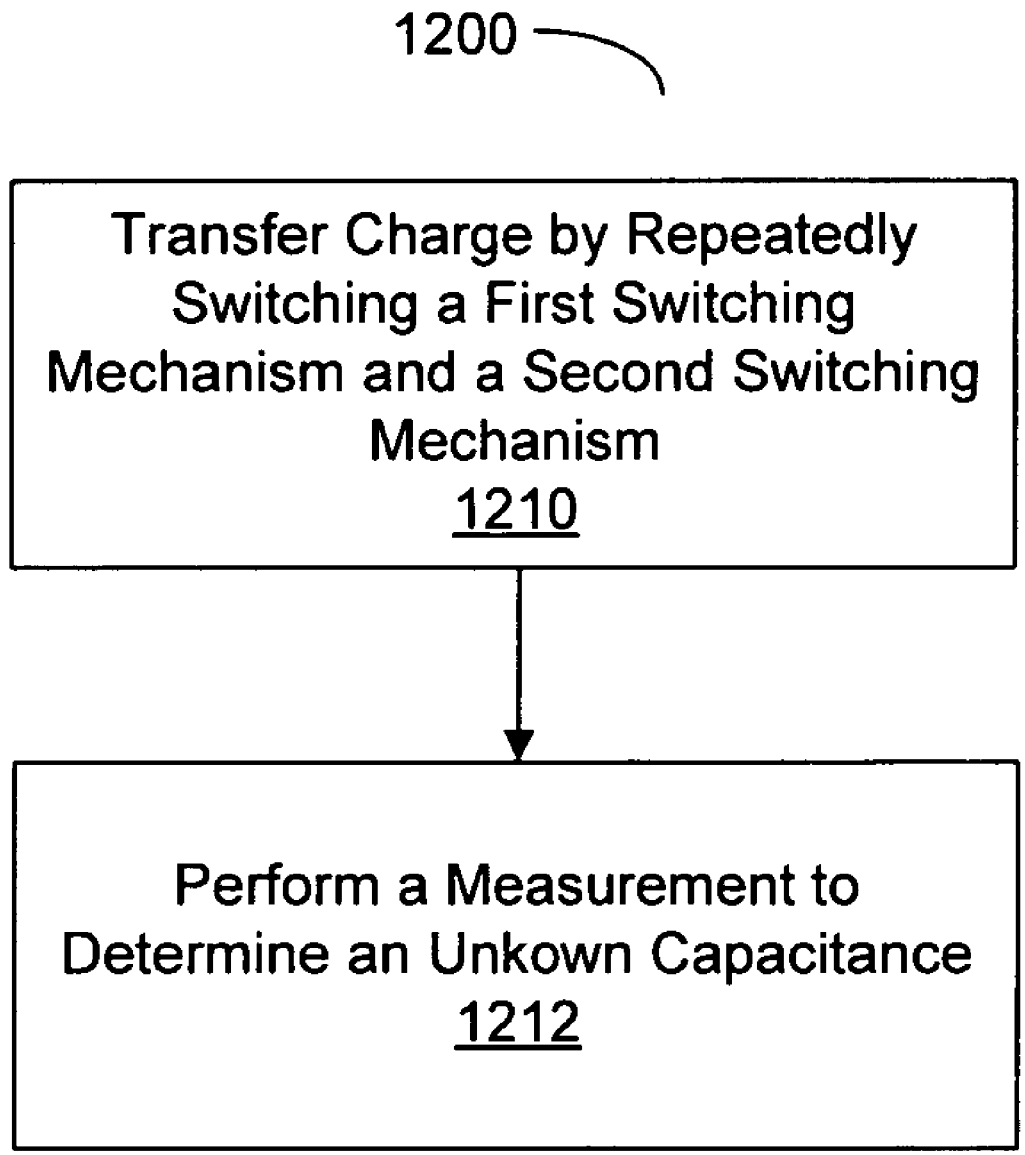
FIG. 12 is a flow chart illustrating a process of performing a capacitance measurement.

Attention is now directed towards a method of performing a capacitance measurement. FIG. 12 is a flow chart illustrating a process 1200 of performing a capacitance measurement. Charge is transferred by repeatedly switching a first switching mechanism and a second switching mechanism (1210) in a rectifying circuit, such as the rectifying circuit 510 (FIG. 9). A measurement is performed to determine an unknown capacitance (1212). In some embodiments, there may be additional or fewer operations. An order of the operations may be changed. Two or more operations may be combined into a single operation.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An electrical circuit for determining a capacitance, comprising:
    a first device having a first terminal and a second terminal, wherein the first device has a first unknown capacitance and the first terminal is configured to receive a time-varying voltage signal;
    a rectifying circuit having an input terminal, an output terminal and a feedback terminal, wherein the input terminal is coupled to the second terminal and the output terminal is configured for coupling to an output electrical circuit, wherein the rectifying circuit is a switched capacitor circuit including a first switching mechanism and a second switching mechanism and wherein the first switching mechanism substantially conducts current and the second switching mechanism substantially blocks current for a first pre-determined duration of time, and the first switching mechanism substantially blocks current and the second switching mechanism substantially conducts current for a second pre-determined duration of time, and wherein the output electrical circuit is a switched capacitor circuit including a third switching mechanism and a fourth switching mechanism, and wherein the third switching mechanism substantially conducts current and the fourth switching mechanism substantially blocks current for a third pre-determined duration of time, and the third switching mechanism substantially blocks current and the fourth switching mechanism substantially conducts current for a fourth pre-determined duration of time; and a feedback circuit, wherein the feedback circuit selectively couples the output terminal to the input terminal using the feedback terminal such that the output terminal and the input terminal are substantially at a common voltage.

2. The electrical circuit of claim 1, further comprising a second device having a third terminal and a fourth terminal and a selection circuit, wherein the second device has a second unknown capacitance and the third terminal is configured to receive the time-varying voltage signal, and wherein the selection circuit is configured to couple the fourth terminal to the input terminal and to decouple the second terminal from the input terminal.

3. The electrical circuit of claim 2, wherein the selection circuit is a multiplexer.

4. The electrical circuit of claim 1, wherein the feedback circuit is a unity gain buffer.

5. The electric circuit of claim 1, wherein the output electrical circuit is a current-measurement circuit and the first unknown capacitance is determined using the current-measurement circuit.

6. The electrical circuit of claim 1, wherein the first switching mechanism couples the input terminal to an output of the feedback circuit when the first switching mechanism conducts current, and the second switching mechanism couples the input terminal to the output terminal when the second switching mechanism conducts current.

7. The electrical circuit of claim 1, wherein the third switching mechanism couples the output terminal to a terminal of a capacitor when the third switching mechanism conducts current and the fourth switching mechanism couples the terminal of the capacitor to ground when the fourth switching mechanism conducts current.

8. The electrical circuit of claim 1, wherein the first unknown capacitance is determined using a measurement of a voltage at the output terminal.

9. The electrical circuit of claim 1, wherein a first time period includes the first pre-determined duration of time and the second pre-determined duration of time, a second time period includes the third pre-determined duration of time and the fourth pre-determined duration of time, and wherein a ratio of the second time period to the first time period is used to adjust the voltage at the output terminal.

10. The electrical circuit of claim 9, wherein an inverse of the first time period and an inverse of the second time period are each approximately between 1 kHz and 1 GHz.

11. The electrical circuit of claim 1, wherein the common voltage is a voltage other than ground.

12. The electrical circuit of claim 1, wherein the first unknown capacitance is approximately between 1 aF and 1 fF.

13. The electrical circuit of claim 1, wherein a plurality of measurements of the first unknown capacitance performed using the electrical circuit are averaged to improve a signal-to-noise ratio.

14. The electrical circuit of claim 1, wherein the first unknown capacitance is determined by averaging a first measurement of the first unknown capacitance and a second measurement of the first unknown capacitance, and wherein the first measurement is performed using a first polarity of the time-varying voltage signal and the second measurement is performed using a second polarity of the time-varying voltage signal.

15. The electrical circuit of claim 1, wherein the first unknown capacitance corresponds to a geometric parameter.

16. The electrical circuit of claim 1, wherein the geometric parameter is selected from the group consisting of a spacing in capacitance-based proximity communication, a spacing in optical communication, an alignment in capacitance-based proximity communication, an alignment in optical communication and a process parameter in semiconductor manufacturing.

17. An electrical circuit, comprising:
  a first means having a first terminal and a second terminal, wherein the first means has a first unknown capacitance and the first terminal is configured to receive a time-varying voltage signal;
  a rectifying means having an input terminal, an output terminal and a feedback terminal, wherein the input terminal is coupled to the second terminal and the output terminal is configured for coupling to an output electrical circuit, wherein the rectifying means is a switched capacitor circuit including a first switching mechanism and a second switching mechanism, and wherein the first switching mechanism substantially conducts current and second switching mechanism substantially blocks current for a first pre-determined duration of time, and the first switching mechanism substantially blocks current and the second switching mechanism substantially conducts current for a second pre-determined duration of time, and wherein the output electrical circuit is a switched capacitor circuit including a third switching mechanism and a fourth switching mechanism, and wherein the third switching mechanism substantially conducts current and the fourth switching mechanism substantially blocks current for a third pre-determined duration of time, and the third switching mechanism substantially blocks current and the fourth switching mechanism substantially conducts current for a fourth pre-determined duration of time; and
  a feedback means, wherein the feedback means selectively couples the output terminal to the input terminal using the feedback terminal such that the output terminal and the input terminal are substantially at a common voltage.

* * * * *